United States Patent [19]

Murakami et al.

[11] Patent Number: 4,521,073

[45] Date of Patent: Jun. 4, 1985

[54] INFRARED LIGHT TRANSMITTING FIBER AND PROCESS FOR PRODUCING THE SAME

[75] Inventors: Kazuhito Murakami; Kenichi Takahashi, both of Osaka, Japan

[73] Assignee: Sumitomo Electric Industries, Ltd., Osaka, Japan

[21] Appl. No.: 338,941

[22] Filed: Jan. 12, 1982

[30] Foreign Application Priority Data

Jan. 12, 1981 [JP] Japan ................ 56-2146

[51] Int. Cl.³ .............................................. G02B 5/172
[52] U.S. Cl. .................................. 350/96.34; 350/96.30
[58] Field of Search ............... 350/96.29, 96.30, 96.34; 264/1.5

[56] References Cited

U.S. PATENT DOCUMENTS

| 4,133,664 | 6/1977 | Aulich et al. ............... 264/1.5 |
| 4,253,731 | 3/1981 | Anderson et al. ............ 350/96.3 |
| 4,315,667 | 2/1982 | Nakegome et al. .......... 350/96.34 |

FOREIGN PATENT DOCUMENTS

| 89704 | 7/1981 | Japan ............................. 350/96.34 |
| 2077937 | 12/1981 | United Kingdom .......... 350/96.34 |

OTHER PUBLICATIONS

Single-Crystal Fiber Wareguides for the Middle Infrared Range, Vasilev, et al., Kvantoraya Elektron (Moscow) 8, 1378-1379 (Jun. 1981).
Crystal Materials for Infrared Fibers, D. J. Krus, et al., The Harshaw Chemical Company, Feb. 1981.

*Primary Examiner*—William L. Sikes
*Assistant Examiner*—Akm E. Ullah
*Attorney, Agent, or Firm*—Sughrue, Mion, Zinn, Macpeak, and Seas

[57] ABSTRACT

An infrared light transmitting optical fiber and a process for producing the same are disclosed. The infrared light transmitting optical fiber is produced by a process comprising preparing a core crystalline fiber having a high melting point and a high refractive index, forming around the core fiber a continuous layer of cladding crystal having a low melting point and a low refractive index, and subsequently forming a protective layer on the resulting step-index fiber.

13 Claims, 8 Drawing Figures

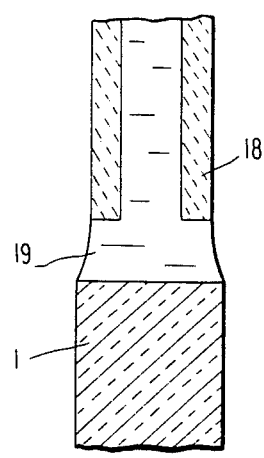
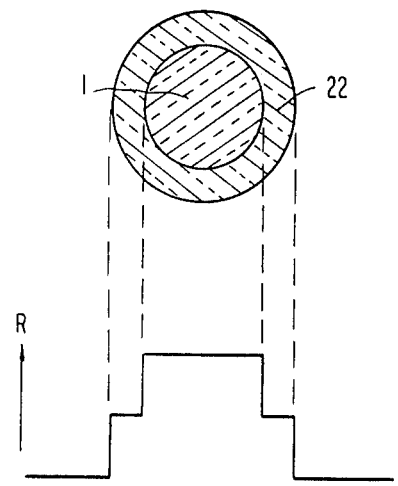
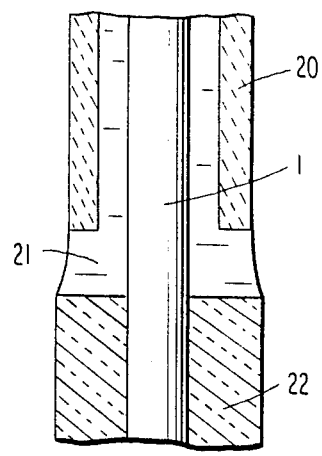
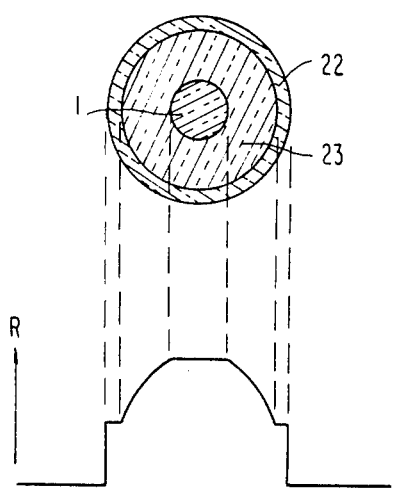

INFRARED LIGHT TRANSMITTING FIBER AND PROCESS FOR PRODUCING THE SAME

FIELD OF THE INVENTION

The present invention relates to an optical fiber adapted for transmitting infrared light, particularly a $CO_2$ laser beam (wavelength: 10.6 μm) that is capable of producing high power output.

BACKGROUND OF THE INVENTION

Infrared light is widely used in machine tools such as $CO_2$ laser welder or cutting machine, or in measuring instruments such as spectral analyzer or IR thermometer. Flexible optical fibers are used as an infrared light guide, and they are advantageous in that they can transmit light along a desired path. The fibers currently employed for optical communication are made of quartz glass and other oxide glass, but they cannot be used for transmitting infrared light because they have great transmission loss. Attempts have been made to produce a polycrystalline fiber by hot-extruding thallium halide such as KRS-5 [TlBr (45.7 mol%)-TlI (54.3 mol%)] or a silver halide such as silver chloride or silver bromide. In another attempt, a fiber is produced by growing a molten salt of KRS-5 or silver bromide into a single crystal having a diameter of 0.4 to 1 mm. The fiber obtained is loosely fitted into a Teflon or other resin pipe and used as a structure wherein the fiber is a core and air is a cladding. With such structure, if an alkali metal halide is used as the infrared light transmitting crystalline material, the fiber absorbs the moisture of the air cladding and often undergoes mechanical or optical deterioration. If the fiber is made of a less hygroscopic but softer thallium halide, silver halide or alkaline earth metal halide, freedom of the movement of the fiber within the pipe causes slip deformation of the halide crystal, and as a result, the optical properties of the surface of the core fiber are impaired by surface roughening or light scattering, and at the same time, the fiber fatigues to increase the chance of deteriorated mechanical properties.

These defects may be eliminated by preparing a fiber having a refractive index distribution to confine the light to be transmitted within the fiber and by reinforcing the fiber with a protective coating that is in close contact with the fiber. But if a fiber consisting of a core of high refractive index and a cladding of low refractive index is produced by hot extrusion, the crystal grains making the core and cladding have a size of from several micrometers to several hundreds of micrometers and an irregular interface is easily formed between the core and cladding. Furthermore, if a crystalline fiber is prepared from molten material, the melting point of the infrared light transmitting crystal serving as the core is generally lower than that of the infrared light transmitting crystal serving as the cladding, and the cladding crystal cannot be grown around the core crystal without melting the latter. It has therefore been difficult to produce a crystalline fiber having the desired refractive index distribution whether it is a polycrystalline or single crystal fiber.

SUMMARY OF THE INVENTION

It is therefore an object of the present invention to provide a mechanically reinforced infrared light transmitting optical fiber of low transmission loss that has a refractive index distribution to confine the infrared light to be tranmitted within the fiber and which has a protective coating in close contact with the fiber. This object of the present invention can be achieved by a new method wherein a core crystalline fiber having a high melting point and high refractive index and a cladding having a low melting point and low refractive index are grown from a molten infrared light transmitting crystal.

BRIEF DESCRIPTION OF THE INVENTION

FIG. 5 is an enlarged view showing the vicinity of a small tube 18 which is connected to the bottom of a crucible 4 in FIG. 4 and wherein a core crystalline fiber grows;

FIG. 6 is an enlarged view showing the vicinity of a small tube 20 which is connected to the bottom of a crucible 10 in FIG. 4 and wherein the core crystalline fiber is coated with a cladding crystal;

FIG. 7 is a cross section of an infrared light transmitting fiber of step-index according to one embodiment of the present invention; and FIG. 8 is a cross section of an infrared light transmitting fiber of substantially gradient index type according to another embodiment that is prepared by heat-treating the step-index infrared light transmitting fiber of FIG. 7 so as to provide a gradient in concentration between the cladding and core through diffusion.

DETAILED DESCRIPTION OF THE INVENTION

The present invention provides an infrared light transmitting fiber which consists of a core made of an infrared transmitting crystalline material or a mixed crystal thereof having a high melting point and high refractive index and an infrared light transmitting crystalline material or a mixed crystal thereof having a low melting point and low refractive index. Such fiber is produced by first preparing a fiber core made of a crystal or a mixed crystal having a high melting point and high refractive index, and then forming around said core a continuous cladding made of a crystal or a mixed crystal having a low melting point and low refractive index.

The terms "the crystal of a single component" and "mixed crystal" as used herein mean not only a pure crystal but also a crystal containing a trace impurity in such an amount that it does not greatly change the melting point or refractive index of such crystal. An example of the trace impurity is calcium chloride that is added in an amount of about 100 ppm to improve the mechanical strength of potassium chloride.

Examples of the infrared light transmitting material that can be used in the present invention include an alkali metal halide such as potassium chloride, potassium bromide, potassium iodide, sodium chloride, sodium bromide, sodium iodide, rubidium chloride or cesium chloride; a thallium halide such as thallium bromide, thallium iodide or thallium chloride; and a silver halide such as silver chloride, silver bromide or silver iodide. The heavier the element, the lower the melting point and the higher the refractive index of the resulting infrared light transmitting crystal. Therefore, if the melting process is used to form a cladding around the single crystal core fiber, the core having a lower melting point than the cladding melts down without forming a fiber of step-index type.

Figure 1:
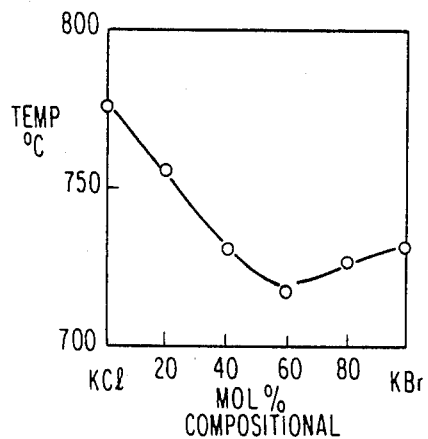
FIG. 1 is a liquidus for a potassium chloride-potassium bromide system.

In order to find the optimum combinations of crystalline materials that can be selected as core and cladding, the present invention prepared mixed crystals of alkali metal halides, thallium halides and silver halides and measured their melting point and refractive index. First, the present inventors measured the melting point of the combination of potassium bromide and potassium chloride in various proportions, and found that as shown in FIG. 1, the mixed crystal consisting of 40 mol% of potassium chloride and 60 mol% of potassium bromide has the lowest melting point, and that this combination provides a uniform mixed crystal in all proportions. As indicated in Table 1 below, the mixed crystal of 40 mol% potassium chloride and 60 mol% potassium bromide has a refractive index of 1.50 at 1.06 $\mu$m and 1.48 at 10.6 $\mu$m, and these values are in between the refractive indices of potassium chloride and potassium bromide. Therefore, a step-index fiber can be prepared from molten potassium bromide and a mixed crystal thereof having a lower melting point and refractive mide core and a thallium chloride cladding can be produced by the melting process, but a further reduction in the melting point can be achieved by using a mixed crystal of thallium chloride and thallium bromide. Therefore, a crystalline fiber wherein the melting point of the cladding material greatly differs from that of the core material can be produced. For instance, a crystalline fiber can be prepared more easily by using thallium bromide as a core and a mixed crystal of 70 mol% thallium chloride and 30 mol% thallium bromide as a cladding.

Figure 3:
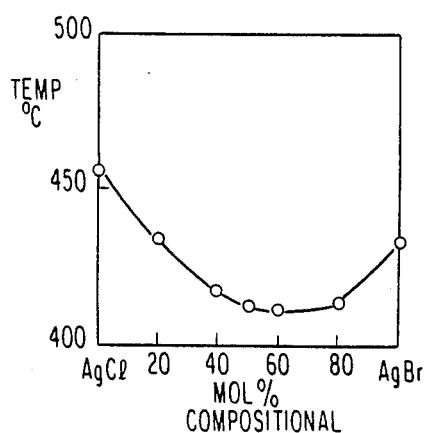
FIG. 3 is a liquidus for a silver chloride-silver bromide system.

The present inventors have also measured the melting point of the combination of silver bromide and silver chloride in various proportions, and have found that as shown in FIG. 3, a mixed crystal which substantially consists of 40 mol% silver chloride and 60 mol% silver bromide has the lowest melting point. The mixed crystal of 40 mol% silver chloride and 60 mol% silver bromide has a melting point of 413° C., and a refractive index of 2.13 at 1.06 $\mu$m and 2.12 at 10.6 $\mu$m, whereas silver bromide has a melting point of 434° C. and a refractive index of 2.30 at 1.06 $\mu$m and 2.25 at 10.6 $\mu$m. Therefore, a fiber consisting of a core having a high refractive index and high melting point and a cladding having a low refractive index and low melting point can be prepared. In a similar manner, a step-index fiber can be produced from the combination of silver bromide and silver iodide.

TABLE 1

| Sample No. | Material | Melting Point (°C.) | Refractive Index 1.06 $\mu$m | 10.6 $\mu$m |
|---|---|---|---|---|
| | Alkali Metal Halide Crystal | | | |
| 1 | Potassium Chloride (KCl) | 776 | 1.48 | 1.45 |
| 2 | Potassium Bromide (KBr) | 730 | 1.54 | 1.53 |
| 3 | Potassium Iodide (KI) | 723 | 1.64 | 1.62 |
| 4 | 40 mol % KCl - 60 mol % KBr | 717 | 1.50 | 1.48 |
| 5 | 40 mol % KBr - 60 mol % KI | 605 | 1.59 | 1.58 |
| | Thallium Halide Crystal | | | |
| 6 | Thallium Chloride (TlCl) | 430 | 2.20 | 1.98 |
| 7 | Thallium Bromide (TlBr) | 460 | 2.30 | 2.25 |
| 8 | Thallium Iodide (TlI) | 440 | 2.48 | 2.40 |
| 9 | 70 mol % TlCl - 30 mol % TlBr | 415 | 2.24 | 2.19 |
| 10 | 46 mol % TlBr - 54 mol % TlI | 410 | 2.44 | 2.37 |
| | Silver Halide Crystal | | | |
| 11 | Silver Chloride (AgCl) | 455 | 2.02 | 1.98 |
| 12 | Silver Bromide (AgBr) | 434 | 2.30 | 2.25 |
| 13 | 40 mol % AgCl - 60 mol % AgBr | 413 | 2.13 | 2.12 | index as shown in FIG. 1 by using the potassium bromide as a core and the mixed crystal as a cladding. A step-index fiber can also be prepared from the combination of a mixed crystal having a higher melting point and refractive index and another mixed crystal having a lower melting point and refractive index. The combination of potassium bromide and potassium iodide can also provide a step-index fiber.

Figure 2:
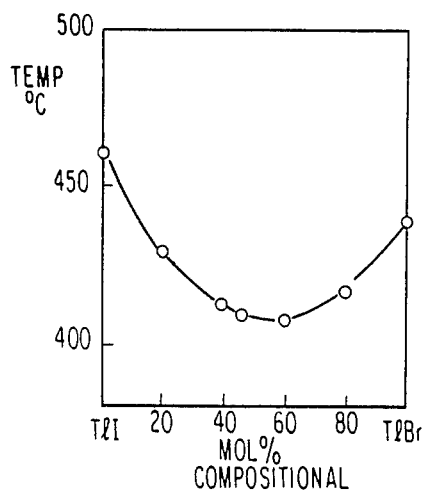
FIG. 2 is a liquidus for a thallium iodide-thallium bromide system.

The present inventors have also found that as shown in FIG. 2, a mixed crystal consisting of 50 mol% thallium bromide and 50 wt% thallium iodide has the lowest melting point. A mixed crystal consisting of 46 mol% thallium bromide and 54 mol% thallium iodide has a melting point of 410° C., and refractive index of 2.44 at 1.06 $\mu$m and 2.37 at 10.6 $\mu$m. Thallium iodide has a melting point of 440° C. and a refractive index of 2.48 at 1.06 $\mu$m and 2.40 at 10.6 $\mu$m. Therefore, a fiber consisting of a core having a high refractive index and high melting point and a cladding having a low melting point and low refractive index can be prepared. Thallium chloride has a lower melting point than that of thallium bromide, so a crystalline fiber having a thallium bro- The step-index fiber thus obtained is subsequently coated with a metallic or resin protective layer that is formed by extruding lead, lead-tin alloy, aluminum, silver, etc. onto the surface of the fiber. The resin protective layer is formed by extrusion-molding molten ABS resin, polybutadiene, polypropylene, polyethylene, polycarbonate, polyvinyl chloride, polyphenylene oxide, polysulfone or a mixture thereof, or by applying and baking polyester imide, polyester, polyurethane, polyol, polyimide, polyamideimide, silicone resin, tetrafluoride resin, epoxy resin or a mixture thereof.

Figure 4:
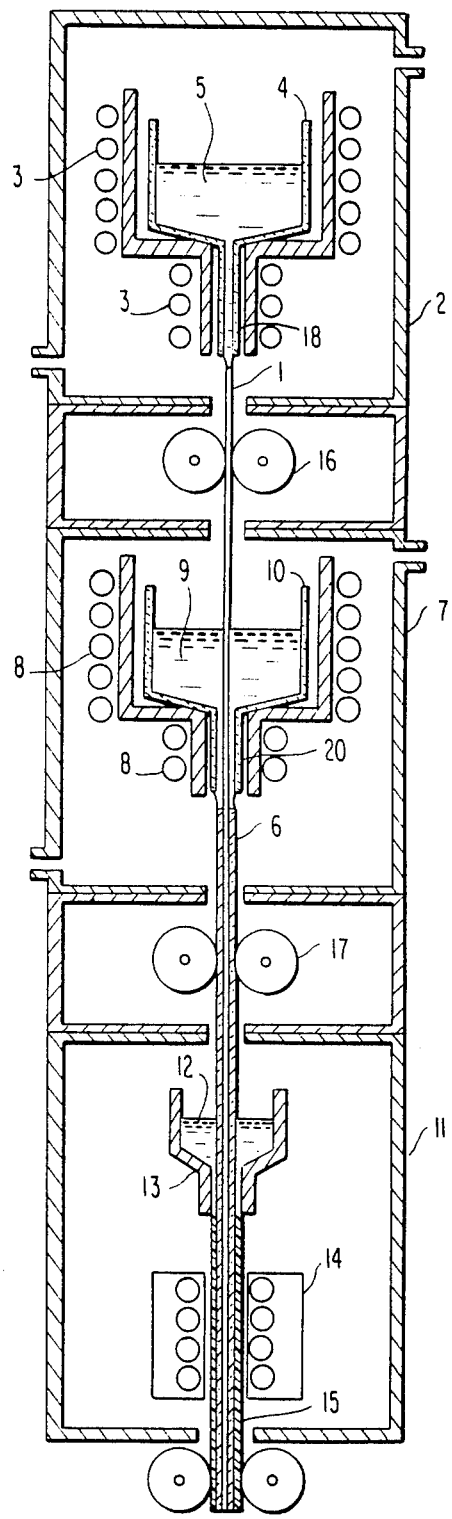
FIG. 4 is a side elevational section schematically representing an apparatus suitable for use in the practice of the process of the present invention.

A side elevational section of an apparatus suitable for practice of the process of the present invention is schematically shown in FIG. 4. A core crystalline fiber 1 is prepared in a chamber 2 which includes a heating furnace 3 and a crucible 4 filled with a core material 5. The core fiber is coated with a cladding in a chamber 7 which includes a heating furnace 8 and a crucible 10 filled with a cladding material 9. The fiber 6 having a cladding is fed to a chamber 11 which includes a crucible 13 filled with a protective resin 12 and a baking furnace 14 for continuous baking of the protective resin layer. Rolls 16 and 17 are provided between the chambers 7 and 11 for adjusting the position of the fiber consisting of the core crystalline fiber and cladding crystal. The fiber 15 having a resin protective layer leaves the chamber 11 and may be fed to another chamber where it is coated with an additional resin or metal layer to be given further protection. The chambers 2 and 7 are preferably filled with an inert gas (e.g., an argon gas) or hydrogen chloride or a chlorine gas to keep the molten infrared transmitting crystal in a stable state.

FIG. 5 is an enlarged view of the tip of a small tube 18 connected to the bottom of the crucible 4. By controlling the temperature of the heating furnace 3, a sharp temperature gradient is created in the vicinity of the tip of the capillary tube 18, so the molten crystal 19 flowing through the tube 18 is cooled and solidifies at the tip of the tube 18. The diameter of the solidifying core crystalline fiber 1 can be modified by controlling the rate of the molten crystal flowing through the tube 18, its surface tension, the growth rate of the crystal, diameter of the tube and the heating temperature.

FIG. 6 is an enlarged view of the tip of a small tube 20 connected to the bottom of the crucible 10. A molten stream of cladding crystal 21 flows between the small tube 20 and the core crystalline fiber 1, and it cools and solidifies around the core fiber 1 to form a cladding 22.

The above procedure yields a step-index type fiber as shown in FIG. 7, wherein the symbol R indicates the scale of refractive index. The fiber can be heat-treated to provide a graded index fiber having a refractive index distribution as shown in FIG. 8 which includes an intermediate layer 23 having a gradient in concentration that is created by mutual diffusion of the core and the crystal or mixed crystal of cladding.

As described in the foregoing, the novel feature of the present invention is the finding that alkali metal halides, thallium halides and silver halides can respectively form a mixed crystal suitable for use as a cladding having a low melting point and a low refractive index. Based on this finding, the present inventors have succeeded in preparing an optical fiber having good infrared light transmittion characteristics by coating a core crystalline fiber having a high melting point and a high refractive index with a cladding having a low melting point and a low refractive index by the melting process to as to form a step-index type fiber having a refractive index distribution to confine the light to be transmitted within the fiber, and coating the resulting fiber with a protective metal or resin layer in close contact with the fiber.

The present invention is now described in greater detail by reference to the following Examples, but they are given for illustrative purposes only is by no means to be construed as limiting the present invention.

EXAMPLE (a) Alkali Metal Halide Cladding

A potassium bromide powder was put in the crucible 4 of FIG. 4 which was heated at 780° C. until it melted. The molten stream coming out of the crucible through the small tube 18 (inside diameter, 0.1 mm) was directed to a platinum wire for cooling and solidification. By controlling the crystal growth rate, a core crystalline fiber having a diameter of 0.6 mm was produced. A powdered mixture of 40 mol% potassium chloride and 60 mol% potassium bromide was put in the crucible 10 and heated at 725° C. at which temperature the mixed powder became molten but not the potassium bromide core fiber. At the tip of the small tube 20, a cladding of the mixed crystal was formed around the core to obtain a step-index fiber having a diameter of 1.0 mm.

(b) Thallium Halide Cladding

A thallium bromide powder was put in the crucible 4 which was heated at 500° C. until it melted. The molten stream coming out of the crucible 4 through the small tube 18 (inside diameter, 0.1 mm) was directed onto a platinum wire for cooling and solidification. By controlling the crystal growth rate, a core crystalline fiber having a diameter of 0.6 mm was produced. A powdered mixture of 70 mol% thallium chloride and 30 mol% thallium bromide was put in the crucible 10 and heated at 450° C. at which temperature the mixed powder became molten but not the thallium bromide core fiber. At the tip of the small tube 20, a cladding of the mixed crystal was formed around the core fiber to obtain a step-index fiber having a diameter of 1.0 mm.

(c) Silver Halide Cladding

A silver bromide powder was put in the crucible 4 which was heated at 500° C. until it melted. The molten stream coming out of the crucible 4 through the small tube 18 (inside diameter, 0.1 mm) was directed onto a platinum wire for cooling and solidification. By controlling the crystal growth rate, a core crystalline fiber having a diameter of 0.6 mm was produced. A powdered mixture of 40 mol% silver chloride and 60 mol% silver bromide was put in the crucible 10 and heated at 430° C. at which temperature the mixed powder became molten but not the silver bromide core fiber. At the tip of the small tube 20, a cladding of the mixed crystal was formed around the core fiber to produce a step-index fiber having a diameter of 1.0 mm.

In either of the above three cases (a) to (c), the fiber was formed at a rate of about 1.0 to 3 cm/min. The fiber was subsequently fed to the crucible 12 where it was coated with silicone or epoxy resin layer, and the fiber was further fed to the heating furnace 14 where the resin layer was baked to obtain an infrared light transmitting fiber having a resin protective layer. In the illustrated embodiment, the molten stream of core material is first directed onto a platinum wire to form a lead before the resin coating is formed around the fiber to enable consistent fabrication of an infrared light transmitting optical fiber. In this manner, a long optical fiber can be produced consistently with the guide rolls 16, 17 and 18.

REFERENCE EXAMPLE

Each of the three optical fibers prepared above was cut into a length of 2 m. A $CO_2$ laser beam (wavelength: 10.6 $\mu$m, output: 10 W) was directed through each fiber, and the outgoing beam was focused by an infrared light converging lens such as zinc selenide and could be used to cut or a bore a hole in a synthetic resin plate of board (e.g., a polyacrylate resin plate or board) or wood.

The infrared light transmitting fiber of the present invention has a protective layer in intimate contact with the fiber, so it has better mechanical characteristics, is more durable and has better infrared light transmission characteristics than the conventional infrared light transmitting fiber wherein a crystalline potassium bromide, silver bromide or thallium bromide fiber is simply loosely fitted in a plastic pipe. In particular, an infrared light transmitting optical fiber that is resistant to hostile conditions such as high humidity and which exhibits consistent optical and mechanical characteristics can be produced by forming an intimate protective coating around a step-index fiber wherein the core is made of an infrared light transmitting crystalline material having a high refractive index and high melting point and the cladding is made of an infrared light transmitting crystalline material having a low refractive index and a low melting point. These optical fibers can be connected to a remote photodetector for monitoring purposes. Alternatively, they are used for directing $CO_2$ laser beams to a laser heating or laser working machine in a remote or inaccessible site.

While the invention has been described in detail and with reference to specific embodiments thereof, it will be apparent to one skilled in the art that various changes and modifications can be made therein without departing from the spirit and scope thereof.

What is claimed is:

1. An infrared light transmitting optical fiber having a protective coating formed in intimate contact around a step-index fiber having a core and a cladding wherein the core is an infrared light transmitting crystalline material and the cladding is an infrared light transmitting crystalline material,
   wherein the core material has a higher melting point and a higher refractive index than the cladding material.

2. An infrared light transmitting optical fiber according to claim 1, wherein the infrared light transmitting crystalline material is selected from the group consisting of a crystal of a single component of an alkali metal halide and a mixed crystal of different alkali metal halides.

3. An infrared light transmitting optical fiber according to claim 2, wherein the alkali metal halide is selected from the group consisting of potassium chloride, potassium bromide, potassium iodide, sodium chloride, sodium bromide, sodium iodide, rubidium chloride and cesium chloride.

4. An infrared light transmitting optical fiber according to claim 2, wherein the mixed crystal of alkali metal halides is selected from the group consisting of combinations of potassium chloride and potassium bromide, potassium iodide and potassium bromide, sodium bromide and sodium chloride, sodium iodide and sodium bromide, potassium chloride and rubidium chloride, and cesium chloride and rubidium chloride.

5. An infrared light transmitting optical fiber according to claim 1, wherein the infrared light transmitting crystalline material is selected from the group consisting of a crystal of a single component of a thallium halide and a mixed crystal of different thallium halides.

6. An infrared light transmitting optical fiber according to claim 5, wherein the thallium halide is selected from the group consisting of thallium chloride, thallium bromide and thallium iodide.

7. An infrared light transmitting optical fiber according to claim 5, wherein the mixed crystal of thallium halides is selected from the group consisting of a combination of thallium bromide and thallium chloride and a combination of thallium iodide and thallium bromide.

8. An infrared light transmitting optical fiber according to claim 1, wherein the infrared light transmitting crystalline material is selected from the group consisting of a crystal of a single component of a silver halide and a mixed crystal of different silver halides.

9. An infrared light transmitting optical fiber according to claim 8, wherein the silver halide is selected from the group consisting of silver chloride, silver bromide and silver iodide.

10. An infrared light transmitting optical fiber according to claim 8, wherein the mixed crystal of silver halides is selected from the group consisting of a combination of silver chloride and silver bromide and a combination of silver bromide and silver iodide.

11. A process for producing an infrared light transmitting optical fiber which comprises preparing a core crystalline fiber, forming around the core fiber a continuous layer of cladding crystal, and subsequently forming a protective layer on the resulting step-index fiber,
    wherein the core material has a higher melting point and a higher refractive index than the cladding material.

12. A process according to claim 11, wherein said protective layer is selected from the group consisting of a metal layer, a resin layer, and a combination thereof.

13. A process according to claim 11, wherein the step-index fiber consisting of a core crystal having a high melting point and a high refractive index and a cladding crystal having a low melting point and a low refractive index is prepared by first melting the core crystal in a crucible, directing the molten stream of the core crystal through a small tube connected to the bottom of the crucible, cooling and solidifying the molten core crystal at the tip of said tube, supplying the resulting core crystalline fiber to a crucible where the cladding crystal is melted, directing said core fiber through a small tube connected to the second crucible so as to coat the core crystal in a solid state with the molten cladding crystal, and cooling and solidifying the molten stream of the cladding crystal at the tip of the second small tube.

* * * * *